(12) United States Patent
Shah Al-Mamun et al.

(10) Patent No.: US 12,707,903 B2
(45) Date of Patent: Aug. 11, 2026

(54) HEAT DISSIPATION IN RESISTIVE MEMORIES

(71) Applicant: VIRGINIA TECH INTELLECTUAL PROPERTIES, INC., Blacksburg, VA (US)

(72) Inventors: Mohammad Shah Al-Mamun, Blacksburg, VA (US); Marius Orlowski, Pembroke, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 449 days.

(21) Appl. No.: 17/625,968

(22) PCT Filed: Aug. 28, 2020

(86) PCT No.: PCT/US2020/048307
§ 371 (c)(1),
(2) Date: Jan. 10, 2022

(87) PCT Pub. No.: WO2021/041752
PCT Pub. Date: Mar. 4, 2021

(65) Prior Publication Data

US 2022/0246846 A1 Aug. 4, 2022

Related U.S. Application Data

(60) Provisional application No. 62/894,337, filed on Aug. 30, 2019.

(51) Int. Cl.
*H10N 70/00* (2023.01)
*H10B 63/00* (2023.01)

(52) U.S. Cl.
CPC ......... *H10N 70/8613* (2023.02); *H10B 63/80* (2023.02); *H10N 70/011* (2023.02)

(58) Field of Classification Search
CPC .. H10N 70/8613; H10N 70/011; H10B 63/80; G11C 2213/52; G11C 2213/77
See application file for complete search history.

(56) References Cited

U.S. PATENT DOCUMENTS 9,640,759 B1 5/2017 Curioni et al.
11,283,020 B1 * 3/2022 Tsui .................... H10N 70/826
(Continued)

FOREIGN PATENT DOCUMENTS

CN 106958749 A * 7/2017
WO 2018182678 A1 10/2018

OTHER PUBLICATIONS

Machine-made English-language translation of CN-106958749-A.*
(Continued)

*Primary Examiner* — Bitew A Dinke
(74) *Attorney, Agent, or Firm* — Perilla Knox & Hildebrandt LLP; Jason M. Perilla

(57) ABSTRACT

A semiconductor memory device designed to mitigate degradation due to heat, and methods of forming such a device, are described. In one example, a memory cell in a memory device includes an insulating layer formed over a substrate, a horizontal crossbar electrode formed over the insulating layer, a metal oxide resistive memory layer formed over the horizontal crossbar electrode, and a vertical crossbar electrode formed over the resistive switching memory layer. In one aspect of the embodiments, the horizontal crossbar electrode includes a thermally conductive horizontal crossbar layer formed over the insulating layer and a platinum horizontal crossbar electrode formed over the thermally conductive horizontal crossbar layer. The thermally conductive horizontal crossbar layer can be a layer of copper for
(Continued)

thermal dissipation of heat away from the memory cell during set and reset operations, reducing degradation in the memory device.

4 Claims, 6 Drawing Sheets

(56) References Cited

U.S. PATENT DOCUMENTS

2007/0159868 A1* 7/2007 Sugita .................... H10B 63/20 365/100
2009/0052226 A1* 2/2009 Lee .................... G11C 13/0007 365/148
2014/0029327 A1* 1/2014 Strachan ................ H10N 70/20 257/E45.002
2014/0291600 A1* 10/2014 Chu .................. H10N 70/8833 257/4
2014/0293678 A1* 10/2014 Orlowski ............. H10N 70/245 257/4
2015/0325790 A1* 11/2015 Wu ...................... H10N 70/026 438/382
2016/0104840 A1* 4/2016 Cook ................. H10N 70/8616 257/4
2017/0133584 A1* 5/2017 Tseng ................... H10N 70/841
2017/0244028 A1* 8/2017 Wang ................. H10N 70/8833
2017/0271410 A1* 9/2017 Zhang .................... H10B 63/80
2017/0316824 A1* 11/2017 Bedau .................. H10N 70/823
2017/0365781 A1* 12/2017 Jang ..................... H10N 70/021
2018/0122856 A1* 5/2018 Banerjee ................ H10B 63/00
2018/0205013 A1* 7/2018 Yi ...................... H10N 70/8833
2018/0331288 A1* 11/2018 Pillarisetty ............ H10N 70/24
2019/0189208 A1 6/2019 Bertin et al.
2020/0006650 A1* 1/2020 Wang ................. H10N 70/8416
2021/0066591 A1* 3/2021 Trinh ..................... H10B 63/30

OTHER PUBLICATIONS

International Search Report and Written Opinion for PCT/US2020/48307 mailed Nov. 20, 2020.

Al-Mamun et al.; "Performance Degradation of Nanofilament Switching Due to Joule Heat Dissipation" www.mdpi.com/journal/electronics; Jan. 9, 2020; vol. 9, 127; pp. 1-11.

Al-Mamun et al.; "Reliability Degradation of Resistive Switching Memory Cells due to Thermal Cross-Talk" Prime Archives in Electronics; Aug. 12, 2020; pp. 1-21.

Al-Mamun et al.; "Performance Degradation Due to Nonlocal Heating Effects in Resistive ReRAM Memory Arrays" MRS Advances; 2019; pp. 2593-2600.

Al-Mamun et al.; "Electron tunneling between vibrating atoms in a copper nano-filament" Scientific Reports; 2021; pp. 1-13.

Al-Mamun et al.; J. Appl. Phys. 129, 055107 (2021); https://doi.org/10.1063/5.0034754 Submitted: Oct. 25, 2020 . Accepted: Jan. 14, 2021 . Published Online: Feb. 3, 2021.

* cited by examiner

HEAT DISSIPATION IN RESISTIVE MEMORIES

CROSS-REFERENCE TO RELATED APPLICATIONS

This application is a 35 U.S.C. § 371 National Stage Patent Application of Patent Cooperation Treaty Application number PCT/US2020/048307, filed Aug. 28, 2020, and titled "HEAT DISSIPATION IN RESISTIVE MEMORIES," which claims the benefit of priority to U.S. Provisional Application No. 62/894,337, filed Aug. 30, 2019, titled "METHOD TO MANUFACTURE HIGHLY RELIABLE RERAM MEMORY CELL WITH IMPROVED THERMAL PROPERTIES OF THE ELECTRODES AND THUS PREVENT THERMAL CROSSTALK BETWEEN THE MEMORY CELLS," the entire contents of both of which applications are hereby incorporated herein by reference.

BACKGROUND

Traditional non-volatile memories based on floating gate metal oxide semiconductor field effect transistors (MOSFETs) have reached certain scaling limits. Thus, a significant amount of effort has shifted to the development of alternative memory cells. Resistive random access memory (ReRAM) memories are one example of a candidate to replace the traditional non-volatile technologies. ReRAM memories are good candidates because they offer a simple architecture, excellent scaling potential, low power consumption, high switching speed, large on/off ratio, and good retention and endurance properties. Resistive memory cells also hold promise for neuromorphic applications.

SUMMARY

A number of different approaches are described herein to mitigate the deterioration or degradation of the electrical properties of neighbor ReRAM memory cells due to nearby, heated ReRAM memory cells. In one example, a memory cell in a memory device includes an insulating layer formed over a substrate, a horizontal crossbar electrode formed over the insulating layer, a resistive switching memory layer formed over the horizontal crossbar electrode, and a vertical crossbar electrode formed over the resistive switching memory layer. In one aspect of the embodiments, the horizontal crossbar electrode includes a thermally conductive horizontal crossbar layer formed over the insulating layer and a horizontal crossbar electrode formed over the thermally conductive horizontal crossbar layer.

In one case, the thermally conductive horizontal crossbar layer can be a layer of copper for thermal dissipation of heat away from the memory cell during set and reset operations, reducing degradation in the memory device. The copper layer can be formed at a first thickness, and the horizontal crossbar electrode can be formed at a second thickness. In one example, the first thickness can be between 100-350 nm and the second thickness can be about 50 nm, although other dimensions can be relied upon. The horizontal crossbar electrode can be made of W, TaN, Co, Ru, Pt or any other suitable electric conductor.

In another aspect of the embodiments, the thermally conductive horizontal crossbar layer can be embodied as a graphene layer for thermal dissipation, as graphene exhibits high thermal conductivity. Alternatively, the thermally conductive horizontal crossbar layer can be embodied as two-dimensional sheets of boron nitride with a diamond like lattice structure or boron nitride nanotubes layer for thermal dissipation. As another alternative, the thermally conductive horizontal crossbar layer can include both a copper layer and a layer of graphene or boron nitride nanocomposits.

In other aspects of the embodiments, the vertical crossbar electrode can include a first vertical crossbar electrode formed over the metal oxide resistive memory layer and a thermally conductive vertical crossbar layer formed over the first vertical crossbar electrode. The first vertical crossbar electrode can include a silver, nickel, or tantalum vertical crossbar electrode. The thermally conductive vertical crossbar layer can include a copper layer for thermal dissipation. In other cases, the thermally conductive vertical crossbar layer can be embodied as a graphene layer for thermal dissipation, as graphene exhibits high thermal conductivity. Alternatively, the thermally conductive vertical crossbar layer can be embodied as a boron nitride layer for thermal dissipation. As another alternative, the thermally conductive vertical crossbar layer can include both a copper layer and a layer of graphene or boron nitride or any highly thermally conductive material. In still another example, the vertical crossbar electrode can include a copper vertical crossbar layer formed between thermally conductive layers of graphene or boron nitride.

In another embodiment, a method of forming a semiconductor memory device is described. The method includes forming an insulating layer over a substrate, forming a horizontal crossbar electrode over the insulating layer, forming a resistive switching memory layer over the horizontal crossbar electrode, and forming a vertical crossbar electrode over the resistive switching layer. The resistive switching memory layer may be a solid electrolyte or a phase changing material. A solid electrolyte can be implemented as a thin insulating metal oxide or silicon oxide. An example of a phase changing material is titanium oxide with a low and high resistance phase.

The horizontal crossbar electrode can include a thermally conductive horizontal crossbar layer formed over the insulating layer and a horizontal crossbar electrode formed over the thermally conductive horizontal crossbar layer. In one case, the thermally conductive horizontal crossbar layer can be a layer of copper for thermal dissipation of heat away from the memory cell during set and reset operations, reducing degradation in the memory device. The copper layer can be formed at a first thickness, and the horizontal crossbar electrode can be formed of platinum at a second thickness. In one example, the first thickness can be between 100-350 nm and the second thickness can be about 50 nm, although other dimensions can be relied upon.

In another aspect of the embodiments, the thermally conductive horizontal crossbar layer can be embodied as a graphene layer for thermal dissipation, as graphene exhibits high thermal conductivity. Alternatively, the thermally conductive horizontal crossbar layer can be embodied as a boron nitride layer for thermal dissipation. As another alternative, the thermally conductive horizontal crossbar layer can include both a copper layer and a layer of graphene or boron nitride.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments.

DETAILED DESCRIPTION

Figure 1:
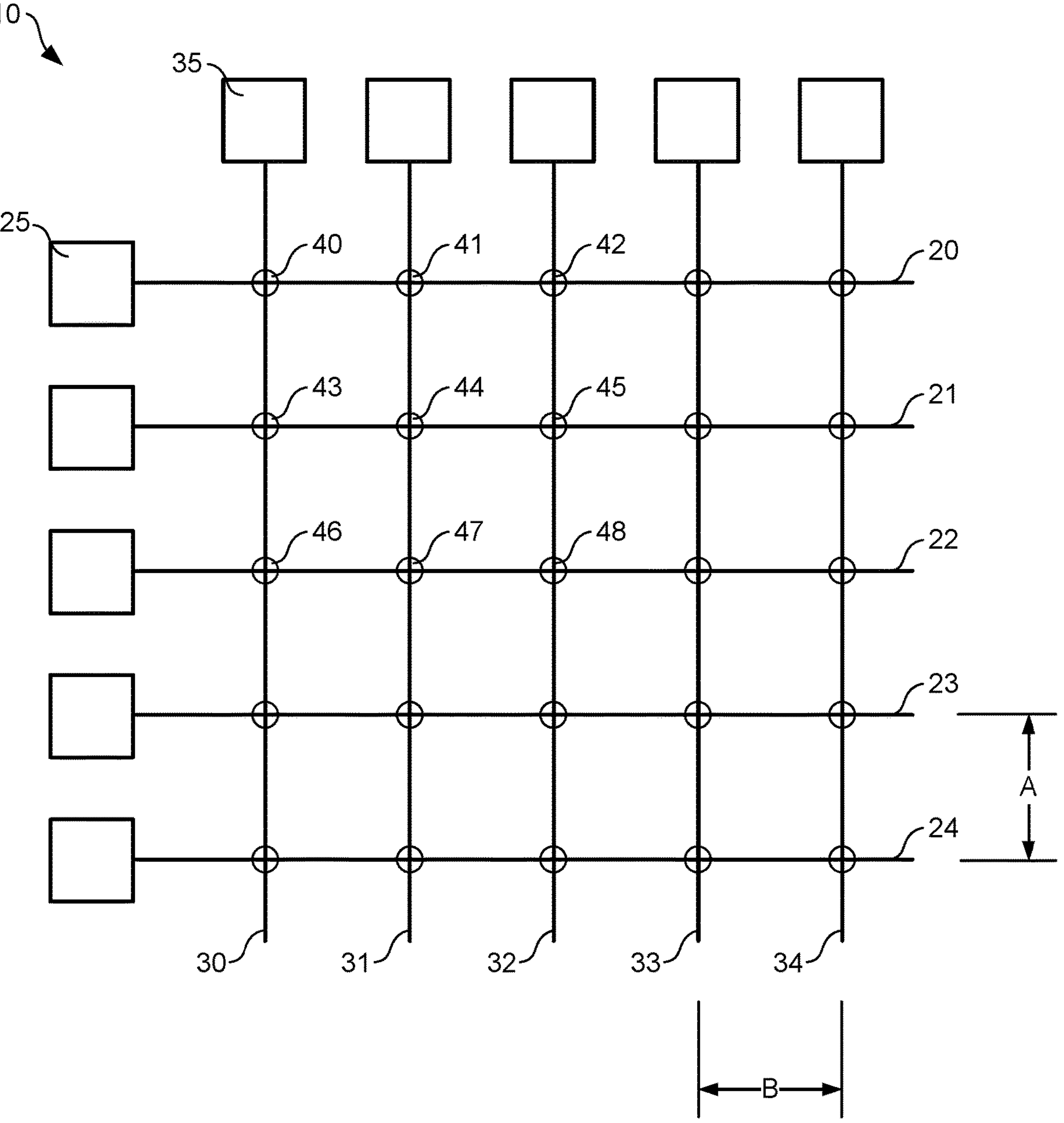
FIG. 1 illustrates an example memory cell crossbar array according to various embodiments described herein.

When a resistive random access memory (ReRAM) memory crossbar array is switched repeatedly, a considerable amount of Joule heat is dissipated in the cells of the array. As detailed below, the heat may spread to neighboring cells in the array. One mechanism for heat spreading in a ReRAM memory crossbar array is conduction along the electrode lines of the ReRAM memory cells.

Cell-to-cell heat transfer in a ReRAM memory crossbar array can result in significant degradation of the electrical performance of neighboring cells. As described below, a metric for the thermal degradation of the I-V characteristics of a cell can be established by a specific conditioning of a so-called "marginal" device, used as a temperature-sensitive probe of electrical performance degradation. Even neighboring cells with no common metal electrode lines with the heated cell can suffer substantial electrical performance degradation, provided that intermediate cells of the array are set into a conductive state, establishing a continuous thermal path via nanofilaments between the heated and probed cells.

The cell-to-cell thermal crosstalk poses a serious electrothermal reliability problem for the operation of ReRAM memory cell crossbar arrays, sometimes requiring modified write/erase algorithms to program the cells. The thermal crosstalk appears to be more severe in nanometer-sized memory arrays, even if operated with ultra fast, nanosecond-wide voltage/current pulses than at larger spatial dimensions discussed in detail below.

A ReRAM memory cell is a two-terminal device. An example cell can include a metal oxide resistive layer, for example, sandwiched between two metal electrodes. The metal oxide resistive layer exhibits a change between high and low resistance states in response to a suitably applied electric field between the metal electrodes. In so-called bipolar resistive devices, the transition from a low resistive state (LRS), characterized by the resistance $R_{on}$, to a high resistance state (HRS), characterized by the resistance $R_{off}$, occurs at an opposite polarity than the switching from HRS and LRS. The resistance switching effect is ascribed to the formation and rupture of conductive nano-filaments (CF) in the matrix of the metal oxide resistive layer due to ionic and charged defect electromigration as well as thermal effects. Another kind of resistive non-volatile memory can be implemented with phase change switching layers. In phase change memory, application of an electric field to the switching layer causes the phase change of the material from conductive to a nonconductive phase and vice versa.

In the case of the so-called electrochemical metallization responsible for the formation of a CF, metal cations of the active metal electrode (e.g., a copper Cu metal electrode) drift in the electric field towards the counter, called also inert, metal electrode (e.g., a platinum Pt metal electrode), where they are stopped and neutralized. Over time, the copper metal atoms pile up on the platinum interface and form a metal nanofilament between the two electrodes. This process constitutes the so-called "SET" operation. In contrast, when a negative voltage is applied to the active electrode, a large current is flowing through the filament depositing Joule heat and causing the Cu atoms to diffuse out leading to the rupturing of the filament at a critical current $I_{reset}$. The rupturing of the filament is called the "RESET" operation.

Joule heating is of importance in both the SET and RESET operations. It has been demonstrated that the RESET operation is dominated by Joule heating. The self-heating effects associated with cell switching can lead to the deterioration of the $R_{off}/R_{on}$ ratio, which is problematic for operation of ReRAM memory cells. This is because the $R_{off}$ resistance decreases as the temperature increases for the off-state, and the $R_{on}$ resistance increases with increasing temperature for the on-state. It is been found that the $R_{off}/R_{on}$ ratio decreased from a value of 20 to approximately 5 over the temperature interval of 213K-413K. Such changes in $R_{on}$ and $R_{off}$ of ReRAM memory cells can cause significant degradation in the computational accuracy of ReRAM based neuromorphic computing systems. Specifically, a hotter cell is more susceptible to generate an incorrect output. The thermal reliability of ReRAM is also a concern for embedded memories for automotive applications.

Overall, switching of a ReRAM memory cell repeatedly leads to an increasing deposition of Joule heat in the device. In standard designs, this heat is largely transported along the electrode metal lines, disproportionately affecting the neighboring cells disposed along the same electrode lines and causing the deterioration of their electrical properties. Even cells with no common metal lines between them can experience thermal transfer, however, when intermediate cells are set into an on-state, establishing a continuous thermal pathway between heated cells and neighbor cells.

In the context outlined above, a number of different approaches are described herein to mitigate the deterioration or degradation of the electrical properties of neighbor ReRAM memory cells due to nearby, heated ReRAM memory cells. In one example, a memory cell in a memory array includes an insulating layer formed over a substrate, a horizontal crossbar electrode formed over the insulating layer, a metal oxide resistive memory layer formed over the horizontal crossbar electrode, and a vertical crossbar electrode formed over the metal oxide resistive memory layer. In one aspect of the embodiments, the horizontal crossbar electrode includes a thermally conductive horizontal crossbar layer formed over the insulating layer and a platinum horizontal crossbar electrode formed over the thermally conductive horizontal crossbar layer. The thermally conductive horizontal crossbar layer can be a layer of copper for thermal dissipation of heat away from the memory cell during set and reset operations, reducing degradation in the memory device.

Turning to the drawings, FIG. 1 illustrates an example memory cell crossbar array 10 ("array 10") according to various embodiments described herein. The array 10 is illustrated to provide a representative example for discussion of the advantages of the embodiments. The array 10 is an example of a filamentary resistive memory array. The thermal characteristics of the array 10, as described below, are common to and exhibited by all types of resistive switching layers, because the basic memory storage mechanism is the change of resistance upon the application of electric fields. Thus, the concepts described herein can be applied to other memory arrays, including memory arrays manufactured using different semiconductor processes, process technologies, and different constructs, for ReRAM and other types of memory.

The array 10 includes a number of a horizontal crossbar electrodes 20-24, a number of vertical crossbar electrodes 30-34, and an array of ReRAM memory cells. The array 10 includes a ReRAM memory cell at the intersection of each horizontal crossbar electrode 20-24 and vertical crossbar electrode 30-34, including the ReRAM memory cells 40-48 in FIG. 1, among others not individually referenced. The design and structure of the ReRAM memory cells 40-48 is described in greater detail below with reference to FIG. 2.

In the array 10, electrical contact pads are provided at one end of the horizontal crossbar electrodes 20-24 and at one end of the vertical crossbar electrodes 30-34. For example, a contact pad 25 is provided at one end of the horizontal crossbar electrode 20, and a contact pad 35 is provided at one end of the vertical crossbar electrode 30. The contact pads can be used to SET, RESET, and read individual ReRAM memory cells. The contact pads 25 and 35, for example, can be used to access the ReRAM memory cell 40. In the following, an experimental memory array is described in detail to demonstrate the nature and impact of the thermal cross-talk effect. The lateral dimensions of the memory array are much larger by a factor up to 1000) than the dimensions of commercial memory arrays. Nevertheless, as it is shown later, the observed thermal effects described below for the experimental array are less severe than for the commercially viable designs. With that in mind, the spacing "A" between the horizontal crossbar electrodes 20-24 can be between about 150 μm and 185 μm, and the spacing "B" between the vertical crossbar electrodes 30-34 can be about can be between about 150 μm and 185 μm. However, the array 10 can be formed with much smaller spacings between the horizontal and vertical crossbars.

Figure 2:
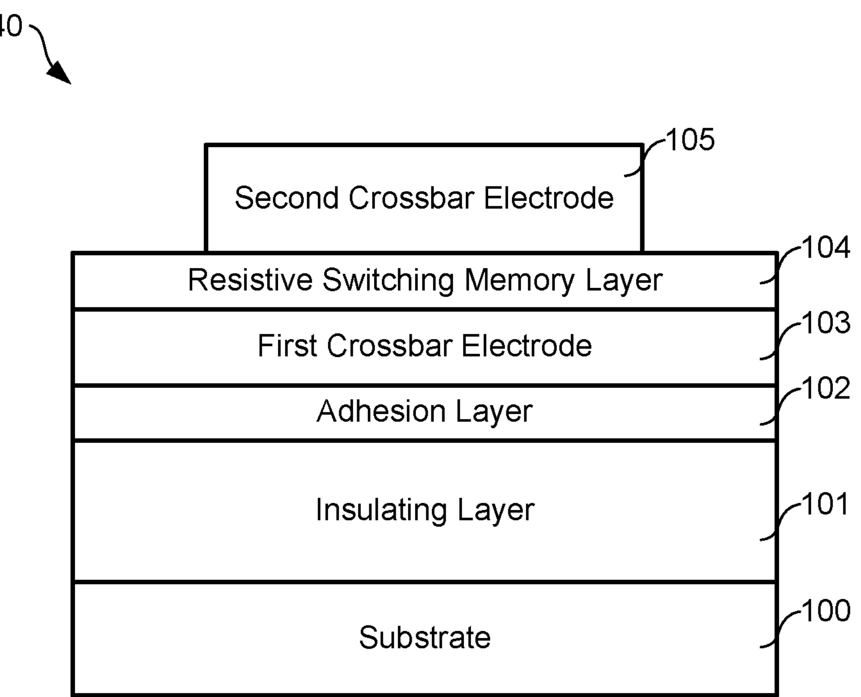
FIG. 2 illustrates a cross section of an example resistive random access memory (ReRAM) memory cell according to various embodiments described herein.

FIG. 2 illustrates a cross section of an example ReRAM memory cell 40 according to various embodiments described herein. The ReRAM memory cell 40 is illustrated as a representative example in FIG. 2. The shapes and relative sizes of the layers of the memory cell 40 are not necessarily drawn to scale in FIG. 2. Example dimensions of the memory cell 40 are described in further detail below, but the dimensions of the layers are not specifically limited. The layers shown in FIG. 2 are also not exhaustive, and any device(s) incorporating the memory cell 40 can include other layers and other elements not separately illustrated. Additionally, the memory cell 40 can be formed as part of a larger integrated circuit device in combination with other devices and circuit elements.

As shown in FIG. 2, the ReRAM memory cell 40 includes a substrate 100, an insulating layer 101, an adhesion layer 102, a first crossbar electrode 103, a resistive switching memory layer 104 ("resistive layer 104"), and a second crossbar electrode 105. In the example shown, the ReRAM memory cell 40 lies at the intersection of the crossbar electrodes 20 and 30, as shown in FIG. 1. As described in further detail below, the first crossbar electrode 103 in FIG. 2 corresponds to a cross section of the horizontal crossbar electrode 20 in FIG. 1, and the second crossbar electrode 105 in FIG. 2 corresponds to a cross section of the vertical crossbar electrode 30 in FIG. 1.

The substrate 100 can be embodied as a silicon (Si) wafer, as one example, although other types of substrates can be relied upon. The insulating layer 101 can be embodied as a silicon dioxide ($SiO_2$) insulating layer of about 730 nm thick, although other types and thicknesses of insulating layers can be relied upon. The insulating layer 101 can be thermally grown in an oxidation furnace or deposited upon the substrate 100 in a physical vapor deposition (PVD) or chemical vapor deposition (CVD) chamber suitable for the process step of forming the insulating layer 101.

The adhesion layer 102 can be embodied as a layer of titanium (Ti) or chromium (Cr) of about 20 nm thick, although other types and thicknesses of adhesion layers can be relied upon. The adhesion layer 102 is formed to provide a surface or foundation upon which to form the first crossbar electrode 103. The adhesion layer 102 can also be deposited upon the insulating layer 101 in a PVD chamber and patterned by using any suitable photolithography, e-beam, ion beam or x-ray patterning technique.

The first crossbar electrode 103 can be embodied as an inert electrode. In one example, the first crossbar electrode 103 may be embodied as a layer of platinum (Pt) of about 50 nm thick, although other types of metals can be relied upon. The first crossbar electrode 103 can be deposited upon the adhesion layer 102 in a PVD chamber and patterned using any suitable photolithography techniques, such as electron beam lithography, ion beam lithography, or x-ray patterning techniques. The width of the first crossbar electrode 103 in the experimental array varies from 5 μm to about 35 μm, although other dimensions can be relied upon.

The resistive layer 104 can be embodied as a layer of phase change material, such as a layer of solid electrolyte material(s) that allows for easy migration of ions. In one example, the solid electrolyte layer can be realized by a thin metal oxide layer, but the solid electrolyte layer can also be realized by a silicon oxide layer and other layers of suitable material(s). As described herein, the resistive layer 104 is capable of changing from a non-conductive phase to conductive phase upon application of appropriate voltages across it. The resistive layer 106 is also capable of changing from a conductive phase to a non-conductive phase upon application of appropriate voltages across it.

In one example, the resistive layer 104 can be embodied or realized as a layer of transition metal oxide, such as $TaO_x$. When $TaO_x$ is relied upon for the resistive layer 104, the resistive layer 104 can be formed at a thickness of about 25 nm, although other thicknesses can be used. The oxygen-deficient $TaO_x$ (where x can be about 1.9) can be deposited in the PVD chamber by evaporating $Ta_2O_5$ pellets without $O_2$ injection into the evaporation chamber. The role of the parameter x in the $TaO_x$ (as opposed to the stoichiometric $Ta_2O_5$) on the resistive switching properties of the ReRAM memory cell 40 has been evaluated in the field and is not discussed further herein. In other examples, the resistive layer 104 can be formed from a phase-change chalcogenide, a binary transition metal oxide, a perovskite, a solid-state electrolyte, an organic charge-transfer complex, an organic donor-acceptor system, a layered insulating material, or another suitable material.

The second crossbar electrode 105 can be embodied as a layer of copper (Cu) of 50 nm-150 nm thick (measured vertically from top to bottom on the page), in one example. The second crossbar electrode 105 can be deposited upon the resistive layer 104 in a PVD chamber and patterned using any suitable photolithography, e-beam, ion beam or x-ray patterning techniques, with a photoresist thickness of 2 μm to provide gently sloped sidewalls. The width of the second crossbar electrode 105 varies in the array in FIG. 1 described in more detail below, such as between about 5 μm to about 35 μm, although other dimensions could be relied upon. The widths of the electrodes 103 and 105 can result in rectangular area of the ReRAM memory cell 40 in the range of about (5 to 35)×(5 to 35) $\mu m^2$.

Figure 3:
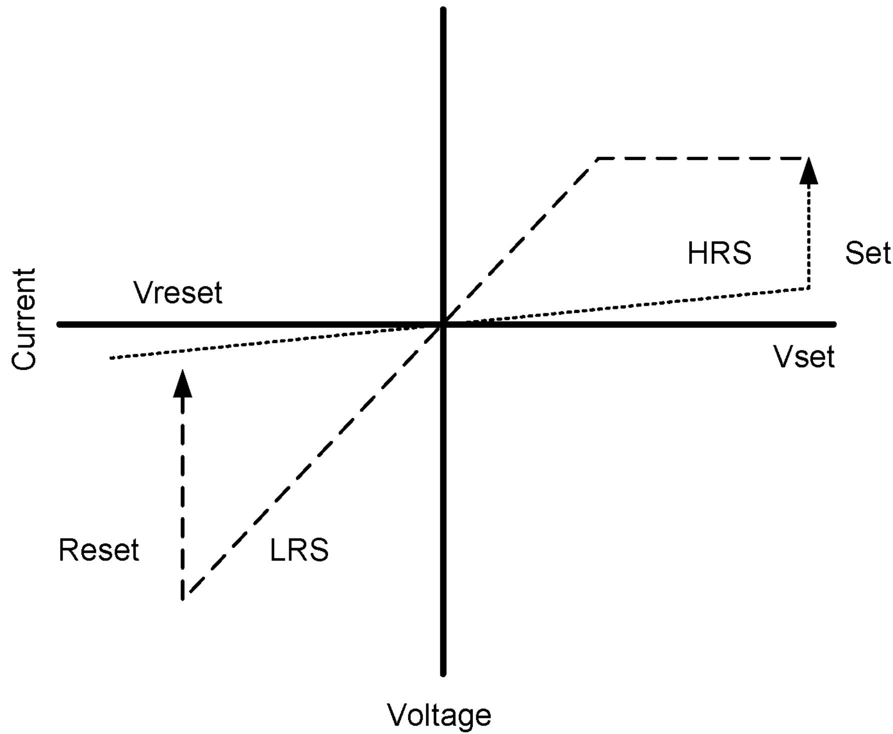
FIG. 3 illustrates an example of I-V characteristics for an example ReRAM memory cell according to various embodiments described herein.

An evaluation of the electrical and performance characteristics of the array 10 was performed at 300K using a probe station. Electric characterization can be conducted by ramping the voltage while monitoring the resulting current to set and reset a memory cell. When operating commercial memory arrays, instead of voltage or current ramps, voltage or current pulses are often used with a very short pulse width. A typical height of a voltage pulse is a few volts and the pulse width 100-500 ns. Before a measurement was taken, the two grounded needles were placed on the cell contacts for at least 20 seconds to make sure that the cell capacitor is fully discharged. Then, for the SET operation, the voltage of the Cu electrode, starting at 0V, was ramped at a ramp rate (rr) ranging from 0.02V/s to 2.00/V/s. During the SET operation, a compliance current ($I_{cc}$) of 5 μA to 1 mA was imposed without an off-chip resistance to avoid damage to the ReRAM memory cell. In commercial applications, the pulse width and pulse height are limiting as to the maximum current flowing through a device and hence an imposition of a limiting current $I_{cc}$ is unnecessary. A Cu conductive filament (CF) was established at a critical positive voltage $V_{set}$. The conductive filament was ruptured at a critical negative voltage $V_{reset}$. Typical I-V characteristics for an example ReRAM memory cell in the array 10 are shown for the SET and RESET operations in FIG. 3.

During the electrical characterization of the ReRAM memory cells, it was noted that the electrical switching of a fresh cell A is degraded when a direct neighbor of cell A, a cell B, has been heated by repeated SET-RESET cycles. The degradation manifested itself by the onset of volatility after the device has been cycled only a few times. This degradation of electrical properties disappeared when the cell A was tested again after 10, 15, or 20 minutes (or a longer cool-off time period). It was hypothesized that the degradation of cell A was due to inter-cell thermal cross talk, which subsides within a few minutes after the heat is dissipated to the ambient.

In one test, a device was set at an $I_{cc}$ of only 10 μA and a voltage ramp rate rr=1.1V/s. When the cell was set at such conditions, the cell becomes volatile after a limited number of sequential SET-RESET switching cycles. One manifestation of this volatility was spontaneous RESET events. The marginality of the device was further demonstrated when it was set at slightly lower and slightly higher $I_{cc}$. When applying $I_{cc}$<7 μA, the device could not be permanently set in a LRS state. When the same device was set at higher compliance currents of 8-10 μA, the LRS state was stable, although only for a very small number of sequential switching cycles, typically 11-14, after which the cell eventually becomes volatile.

An additional test was applied to about 100 cells set at $I_{cc}$=10 μA to estimate a maximum number of consecutive switching cycles before volatility was exhibited. A mean of $M_x$=12.7 cycles and a standard deviation σ=1.3 was obtained. A low rr=0.1V/s was applied during the RESET operation to allow for a long heating time. For a low rr, the current lingers for a long time to maximize heat dissipation. When the maximum number of switching cycles ($M_x$) is reached, the device is driven to highly unstable performance. On the other hand, a device set at $I_{cc}$=40-100 μA can be switched repeatedly more than a hundred times. Thus, a "marginal" device demarcates the boundary between stable and unstable (i.e., volatile) behavior of the cell.

When heated remotely by another cell, a marginal device will have a maximum number of switching cycles smaller than the average, depending by the amount of heating experienced by the cell. Thus, in one sense, $M_x$ defines the onset of the volatility of memory cells in response to the local temperature of the cell. The volatility can be caused, at least in part, by accumulated Joule heat during consecutive switching. When such a probed cell is heated remotely from another (heated) cell, the temperature at which the cell becomes unstable is reached after a fewer number of SET and RESET cycles. Thus, heat from a remote cell can superpose on the heat generated locally by the cell switching itself. In the experimental setup, the time between heating cell B and the characterization of probed cell A is about 50 s—the time required to replace the needles on the probe station. Of course, in commercial testing an automated probe station is being used using voltage and current pulses and thus the switching from one measurement on one of the cells to a measurement of another cell can be done within less than 10 sec.

Figure 4:
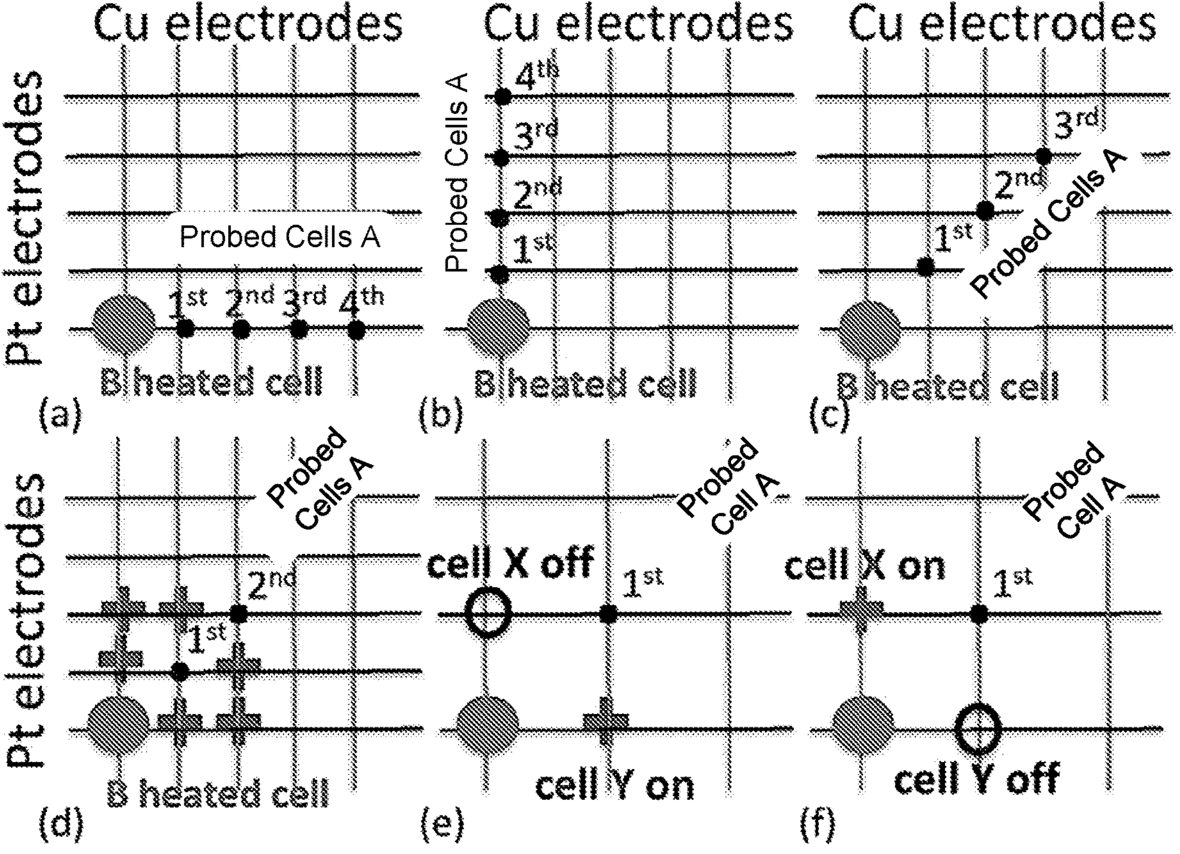
FIG. 4 illustrates examples of heat transfer among neighbor cells according to various embodiments described herein.

FIG. 4 illustrates examples of heat transfer among neighbor cells in a memory array according to various embodiments described herein. In FIG. 4, the heated cell B is marked by a larger dot in the memory array, and the probed cells A are marked by smaller dots. Initially the cells are set in an Off-state. In (a), heat is transported from the heated cell B to neighbor cells A along on the Pt electrode. In (b), heat is transported from the heated cell B to neighbor cells A along the Cu electrode. In (c), heat is transported from the heated cell B to neighbor cells A located diagonally with respect to the heated cell. In (d), heat is transported from the heated cell B to neighbor cells A on diagonal locations with intermediate cells (marked by crosses) in the ON-state. In (e), a thermal path is available from the heated cell B to the $1^{st}$ cell A via the cell Y. In (f), a thermal path is available from the heated cell B to the $1^{st}$ cell A via the memory cell X that has been set to an LRS state.

During the testing of the $1^{st}$, $2^{nd}$, $3^{rd}$, and $4^{th}$ neighboring cells A, it was generally found that the $1^{st}$ neighbor cell A suffered the highest degree of degradation, yielding at most a $M_x$ of 0-3 switching cycles. The $3^{rd}$ and $4^{th}$ neighbor cells A were degraded less, only showing $M_x$ of 9-11, compared with a mean of 13 for a fresh or thermally unaffected cell.

It is possible to estimate the heat dissipated in a ReRAM memory cell during a single reset operation, characterized by a reset current $I_{res}=V_{res}/R_{on}$. Here, $R_{on}$ is the resistance of the LRS state. The reset current is typically 1 mA<$I_{res}$<6 mA for the devices tested experimentally. For a cell to which a constant voltage ramp rate is applied, the Joules heat $Q_{JH}$ can be calculated by Eq. (1) as:

$$Q_{JH} = \int_0^{t_{res}} V^2(t)/R_{on}\,dt = \int_0^{V_{res}/rr} \frac{rr^2 \times t^2}{R_{on}}\,dt = \frac{V_{res}^3 \times I_{cc}}{3 \times rr \times K} \quad (1)$$

Here, the reset time at an applied voltage ramp rate rr is given by $t_{res}=V_{res}/rr$. In Eq. (1), the relation between an $R_{on}$ device is described in terms of experimentally measurable parameters, namely, the compliance current $I_{cc}$, the voltage ramp rate rr, and the reset voltage $V_{res}$. It has been shown that $R_{on}$ depends on $I_{cc}$ via $R_{on}=K/I_{cc}^n$, with n≈1 and K≈0.2V for $Cu/TaO_x/Pt$ devices. Depending on the chosen values for $I_{cc}$ and rr, $Q_{JH}$ can vary from 3 to 60 μJ.

When a cell is switched N times on and off repeatedly and in a quick succession (e.g., 50 s idle time between the set and reset operations), the total heat deposited in the cell will be $Q_{tot}=N\times Q_{JH}\times f$, where f is a dimensionless, positive number, less than unity, accounting for the heat removal out of the device between the subsequent switching events. The metric f can be estimated to be between 0.6 and 0.85. The heat transferred to a neighboring cell, as shown in (a) and (b) of FIG. 4 is then $Q_{tran}=N\times Q_{JH}\times f\times t_{tran}(n)$, where the coefficient $t_{tran}(n)<1$ describes the efficiency of thermal transfer from the heat source cell B to the n-th neighboring cell A along one of the shared electrodes, and $t_{tran}(n)<t_{tran}(n+1)$.

Since the thermal conductivity of Cu (at 390 W/(mK)) and Pt (at 72 W/(mK)) is at least two orders of magnitude higher than the thermal conductivity of $TaO_x$ (at 0.7 W/(mK)), it is clear that the dominant transport path to dissipate Joule heat in the array 10 takes place via the horizontal crossbar electrodes 20-24 and the vertical crossbar electrodes 30-34. Also, due to the thickness of the top Cu electrode of 150 nm (vs 50 nm of the Pt electrode) and the finite size of each ReRAM memory cell 40-48, the low thermal convection through air is very inefficient in dissipating the heat. The experimental memory array was not encapsulated by passivation layers and placed in a chip housing, as would be the case in a commercial memory array. Thus, in commercial memory arrays, thermal transport of the memory cells is not available. Since the array 10 has been manufactured on a Si wafer with a grown field oxide of about 700 nm in thickness, it is reasonable to assume that the main heat transfer is achieved mainly via the metal electrode lines. The Cu filaments in the ReRAM memory cells 40-48, when set in the on-state, complement the network of electrode lines. $I_{cc}$ imposed at the SET operation can modulate the heat transport efficiency through the filament, where a high $I_{cc}$ leading to a low resistance filament will provide a highly conductive thermal path between the Cu and Pt electrodes. A low $I_{cc}$ will provide an inefficient heat transport path, because of the relative thinness of the filament and on account of a small thermal contact area with the Cu electrode.

Several thermal models have attempted to describe the temperature distribution in ReRAM memory cells. One model established a geometrically equivalent circuit to describe how heat flows through a conductive filament, yielding temperature distribution of the memory cell. The critical temperature responsible for the rupturing of a filament is calculated to be about 1225° K. Another work proposed a set of constitutive equations describing the evolution of the heat transport. Based on this work, the temperature responsible for the rupturing of the filament could be as high as about 1500° K. Another study found that the peak temperature of the filament is somewhere between 600° C. and 900° C. Thus, there is a broad consensus that the local temperature of the filament can get to be very high, and this temperature can only increase further when the cell is switched on and off sequentially and frequently.

Referring again to FIG. 4, the electrical degradation of neighbor cells disposed along the Pt electrode line (i.e., (a) in FIG. 4) is described. The cells A were characterized, one by one, immediately after heating the heated cell B. The metric for degradation is established customarily by degradation defined in this context by Eq. (2) as:

$$D = \frac{M_x(\text{unheated cell}) - M_x(\text{heated cell})}{M_x(\text{unheated cell})} \quad (2)$$

The mean of $M_x$ for an unheated cell has been found to be 13 SET-RESET cycles, as described above. The cell degradation results for cells disposed along the Pt electrode are shown below in Table 1 based on 66 devices measured. It can be seen that for the nearest neighbors, the degradation is about D=67%. In contrast, the degradation of the $4^{th}$ device located on the Pt electrode is much smaller, at D=13%. The results could be explained by the heat transfer over a distance of n×160 μm where n=1,2,3,4, corresponding to the $1^{st}$, $2^{nd}$, $3^{rd}$, $4^{th}$ neighboring cell A.

The switching behavior of a cell A is impacted whenever a neighboring heated cell B went through repeated switching cycles. This means that the thermal cross-talk is effective over distances of multiple integers of 150 μm in the electrically tested memory array. This also means that the electrode lines cannot be assumed to be effective heat sinks even for devices subject to no electrical stress. The heat transport over such large distances is further supported by the experimental dependence of the degradation effect on the width of the metal lines. For wider Pt lines (e.g., such as 35 μm wide), the $1^{st}$ neighbor is degraded much less (i.e., $M_x$=6 or D=(13−6)/13=54%) than for narrow Pt lines (e.g., such as 10 μm wide) (i.e., $M_x$=3 or D=(13−3)/13=77%), as the heat is dissipated faster along the wider 35 μm than along a 10 μm Pt line.

The behavior of the cells A located along the Cu electrode (i.e., (b) in FIG. 4) were also characterized. The degradation results are also summarized below in Table 1 (Cu electrode) based on 53 tested cells. The degradation in terms of $M_x$ for cells A disposed along the Cu electrode is significantly larger than the cells A disposed along on the Pt electrode. It can be observed that for the Cu electrode, the distant neighboring cells A are more severely degraded than those for the Pt electrode. Comparison of the $4^{th}$ cell A on the Pt electrode with the $4^{th}$ cell on the Cu electrode shows that the degradation is 5 fold larger for the Cu electrode. This appears to be consistent with the much better heat conductivity of Cu (385 W/(mK)) than Pt (72 W/(mK)).

As a general trend, the same electrode width dependence was identified with the Cu electrode as for the Pt electrode. For a relatively wide Cu electrode of 35 μm, the next neighbor cell is degraded much less than for a narrower Cu electrode of 10 μm. Also, the coefficient $t_{trans}$ for the Cu electrode is larger than for the Pt electrode, due to the larger thickness and the higher thermal conductivity of the Cu electrode than the Pt electrode.

TABLE 1

Degradation of Neighbor Cells

| | Neighbor Cell to Heated Cell Along Pt Electrode | | | | Neighbor Cell to Heated Cell Along Cu Electrode | | | |
|---|---|---|---|---|---|---|---|---|
| Neighbor # | 1st | 2nd | 3rd | 4th | 1st | 2nd | 3rd | 4th |
| D % | 67 | 53 | 40 | 13 | 80 | 75 | 70 | 67 |

Additionally, the neighboring cells A that have neither Pt nor Cu electrode lines in common with the heated cell B were also investigated. In FIG. 4, (c) shows three neighbor cells A of the heated cell B that do not share Pt or Cu electrodes with the heated cell B. The cells in (c) were electrically characterized under two different conditions: 1) the intermediate cells between the heated cell B and the tested cells A are in a non-conductive off-state, and 2) the intermediate cells are preset to a conductive on-state at $I_{cc}$=100 μA, as shown in (d) of FIG. 4. The $I_{cc}$=100 μA applied to the cells marked by crosses in (d) ensures that a low resistance Cu filament is formed with $R_{on}$ typically between 450 and 550Ω. Such a low resistance, robust filament is assumed to provide a path of high thermal conductivity between the horizontal (here Pt) and vertical (here Cu) electrodes.

In the first case shown in (c), no degradation of the maximum switching cycles $M_x$ for any of the diagonal neighbor cells A was found. This was expected since there was no thermally (metallic) conductive path between the heated cell B and the neighbor cells A. However, when the cells marked by crosses are preset to a conductive, LRS state in (d) of FIG. 4, the first diagonal neighboring cell A was found to be degraded considerably. A degradation of D=19% was found for the $1^{st}$ diagonal neighbor cell A. The product of degradation 0.67×0.80=0.53=53% (see Table 1) being larger than 0.19 indicates that the Cu filament, despite its nanometer cross-section (but, apparently by virtue of its small length of about 25 nm) provides an efficient conduit for heat transport.

Heat transport is proportional to temperature gradient, to the wire cross-section, to the thermal conductivity of the material, and inversely proportional to the length of the wire. The higher heat transport over the Cu electrode indicates that the high conductivity of the Cu electrode more than compensates for the small contact area between the filament and the Cu electrode. The diameter of the filament, assumed to be of cylindrical shape, is about 15 nm. When the thermal conductivity of the Cu filament is assumed to be roughly half of the thermal conductivity of bulk Cu, then one could conclude that the heat transport via a Cu filament 25 nm long is comparable with the heat transport along the Pt electrode over a distance of about 150 μm, assuming similar contact areas with the Cu and Pt electrodes.

It is noted that, in case of the $1^{st}$ diagonal device shown (d) of FIG. 4, there exists two thermal conduction paths between the heated cell B and the $1^{st}$ diagonal neighbor cell B. Evaluation of the electrical degradation of the $1^{st}$ diagonal neighbor cell B with intermediate cells partly in LRS and partly in HRS states, as shown in (e) and (f) of FIG. 4 reveal that the two individual paths contribute differently to the degradation of the 1st diagonal neighbor cell B. The path first along the Cu and then along the Pt electrode (FIG. 4 (*e*)) causes a more severe degradation of the $1^{st}$ diagonal neighbor cell B than the conductive path first along the Pt electrode and then along the Cu electrode (FIG. 4 (*f*)). In (e), the degradation of the $1^{st}$ diagonal neighbor cell B is 7%. In (f), the degradation of the $1^{st}$ diagonal neighbor cell B is 11%. This can be compared to the degradation of the $2^{nd}$ cells along the Cu and Pt electrodes, which are 75% and 53%, showing that the thermal connection via the Cu filament poses a heat transfer bottleneck when compared with the heat transport along the comparatively larger electrode lines.

It is also seen that the two paths contribute constructively (additively) to the overall degradation. These results demonstrate that a low resistance Cu filament in the cells X and Y provides a thermal path to transmit the Joule heat to the $1^{st}$ diagonal neighbor cell B. Testing the degradation of the neighbor cells as a function of the width of the electrodes, which vary between 5 μm and 35 μm in experiments, it was also found that it takes the Joule heat less time to reach the $4^{th}$ neighbor cell A for a 35 μm Cu electrode than for 5 μm or 10 μm Cu electrodes. This indicates that the heat is transmitted faster over large distances by wider electrodes. Overall, the thermal effects observed during testing are representative of the thermal effects that may be observed in other types of resistive memory arrays.

As compared to the array 10 shown in FIG. 1, commercial ReRAM arrays can be significantly smaller in geometrical dimensions, such as in the range of tens of nanometers, with much tighter pitch between crossbar electrodes. Additionally, the SET and RESET operations can be performed with voltage and current pulses and not by the relatively slow voltage or current ramps. In commercial applications, a RESET voltage pulse can be 5V, with a pulse width of a typically 200 ns. Assuming a representative value for $R_{on}$=2000 Ohm, the Joule heat dissipated at the RESET $Q_{JHpulse}$=200 ns×$5^2V^2$/2000Ω=2.5 nJ. This is four orders of magnitude smaller than the Joule heat $Q_{JHramp}$ dissipated at a ramped voltage given by Eq. (1), which is typically 25 μJ.

Commercially-available ReRAM arrays are much smaller with a much tighter pitch. An example commercially-available ReRAM array may have electrodes of 50 nm in width, at a pitch of 100 nm. Calculations indicate that cell-to-cell thermal crosstalk poses an even more serious issue in commercially-available ReRAM arrays despite lower switching Joule heat, due to the much smaller dimensions and the resulting proximity of the memory cells as compared to the experimental memory array described above.

There are a number of ways to mitigate the high heat density in ReRAM arrays. First, it is possible to reduce the heat by lowering the set and reset currents or by using ultra-fast pulses of sub nanosecond widths. Another possibility is an enhanced ability to remove the heat from the arrays quickly and efficiently. As described herein, heat dissipation can be increased by using metallic materials with higher thermal conductivity for the electrodes. Another approach to remove heat is to integrate graphene with the electrodes, as graphene has a thermal conductivity as high as 3000-5000 W/(mK).

Figure 5:
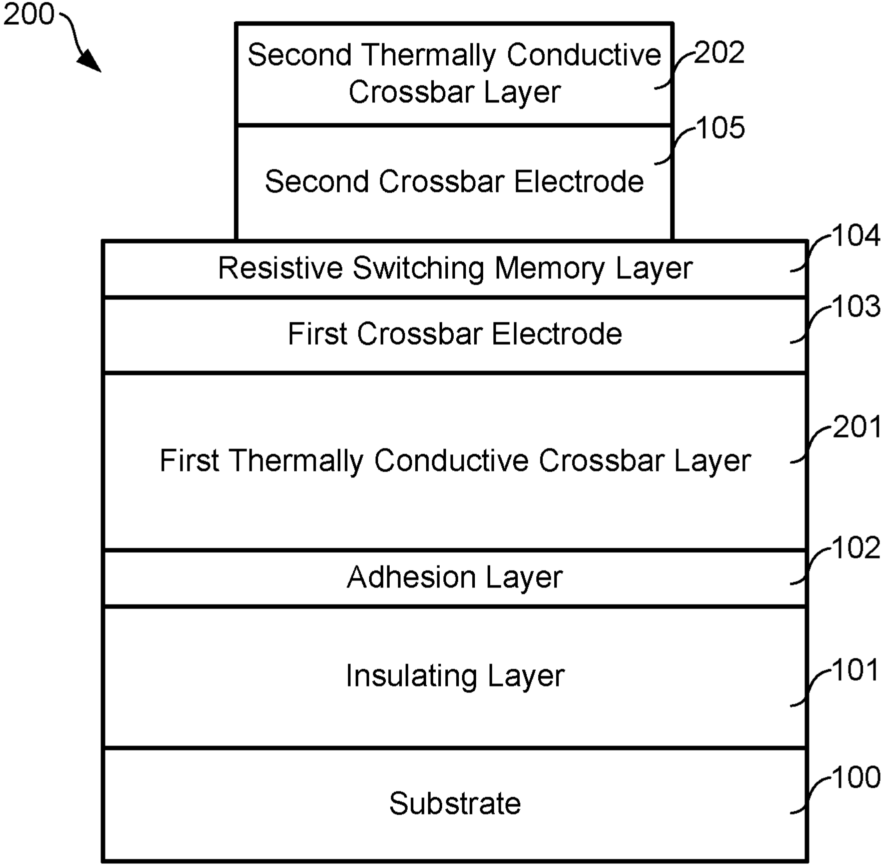
FIG. 5 illustrates a cross section of an example ReRAM memory cell with a thermally conducting layer according to various embodiments described herein.

FIG. 5 illustrates a cross section of an example ReRAM memory cell 200 with a thermally conducting layer according to various embodiments described herein. The ReRAM memory cell 200 is illustrated as a representative example in FIG. 5. The shapes and relative sizes of the layers of the memory cell 200 are not necessarily drawn to scale in FIG. 5. Example dimensions of the memory cell 200 are described in further detail below, but the dimensions of the layers are not specifically limited. The layers shown in FIG. 5 are also not exhaustive, and any device(s) incorporating the memory cell 200 can include other layers and other elements not separately illustrated. Additionally, the memory cell 200 can be formed as part of a larger integrated circuit device in combination with other devices and circuit elements.

As shown in FIG. 5, the ReRAM memory cell 200 includes a substrate 100, an insulating layer 101, an adhesion layer 102, a first thermally conductive crossbar layer 201, a first crossbar electrode 103, a resistive layer 104, a second crossbar electrode 105, and a second thermally conductive crossbar layer 202. The substrate 100, the layers 101, 102, and 104, and the electrodes 103 and 105 are similar to those shown in FIG. 2 for the memory cell 40. As compared to the memory cell 40, the memory cell 200 also includes the thermally conductive crossbar layers 201 and 202, for thermal dissipation. In some cases, either the first thermally conductive crossbar layer 201 or the second thermally conductive crossbar layer 202 can be omitted from the memory cell 200.

The first thermally conductive crossbar layer 201 can be embodied as a layer of Cu at a first thickness (measured vertically from top to bottom of the page), and the first crossbar electrode 103 can be formed at a second thickness. In one example, the thickness of the Cu in the thermally conductive crossbar layer 201 can be between 100-350 nm, and the thickness of first crossbar electrode 103 can be about 50 nm, although other dimensions or thicknesses of the thermally conductive crossbar layer 201 can be relied upon.

The second thermally conductive crossbar layer 202 can be embodied as a layer of Cu at a first thickness (measured vertically from top to bottom of the page), and the second crossbar electrode 105 can be formed at a second thickness. In one example, the thickness of the Cu in the second thermally conductive crossbar layer 202 can be between 100-350 nm, and the thickness of second crossbar electrode 105 can be about 50 nm, although other dimensions or thicknesses of the second thermally conductive crossbar layer 202 can be relied upon. In another example, the second crossbar electrode 105 can be embodied as a layer of silver, nickel, or tantalum at between 35-50 nm, and the second thermally conductive crossbar layer 202 of Cu can be formed over the second crossbar electrode 105.

The Cu in the thermally conductive crossbar layers 201 and 202 help to dissipate and transfer heat away from the memory cell 200. The same experiments described above with reference to FIG. 4 were also conducted using an array of ReRAM memory cells similar to the memory cell 200 shown in FIG. 5. The experiments were conducted with thermally conductive crossbar layers 201 and 202 of 200 nm of Cu, as shown in Table 2, and with thermally conductive crossbar layers 201 and 202 of 100 nm of Cu, as shown in Table 3.

TABLE 2

Degradation of Neighbor Cells

| Pt 50 nm/Cu 200 nm | Neighbor Cell to Heated Cell Along Pt Electrode | | | | Neighbor Cell to Heated Cell Along Cu Electrode | | | |
|---|---|---|---|---|---|---|---|---|
| Neighbor # | 1st | 2nd | 3rd | 4th | 1st | 2nd | 3rd | 4th |
| D % | 0 | 0 | 0 | 0 | 11 | 0 | 0 | 0 |

TABLE 3

Degradation of Neighbor Cells

| Pt 50 nm/Cu 100 nm | Neighbor Cell to Heated Cell Along Pt Electrode | | | | Neighbor Cell to Heated Cell Along Cu Electrode | | | |
|---|---|---|---|---|---|---|---|---|
| Neighbor # | 1st | 2nd | 3rd | 4th | 1st | 2nd | 3rd | 4th |
| D % | 43 | 1 | 0 | 0 | 71 | 57 | 0 | 0 |

As shown in Table 2 and Table 3, the addition of the thermally conductive crossbar layer 201 significantly reduces degradation in an array including the memory cell 200 shown in FIG. 5, as compared to the memory cell 40 shown in FIG. 2. Additionally, thicker thermally conductive crossbar layers 201 and 202 at 200 nm of Cu resulted in less degradation as compared to thermally conductive crossbar layers 201 and 202 at 100 nm of Cu, as shown by comparing the results in Table 2 and Table 3.

Using the thermally conductive crossbar layers 201 and 202, heat generated in a ReRAM memory cell can be distributed both by the active electrode and the inert electrode. In other aspects of the embodiments, heat dissipation can be further improved by making the thermally conductive crossbar layers 201 and 202 even thicker (e.g., up to 300 nm or more).

Figure 6:
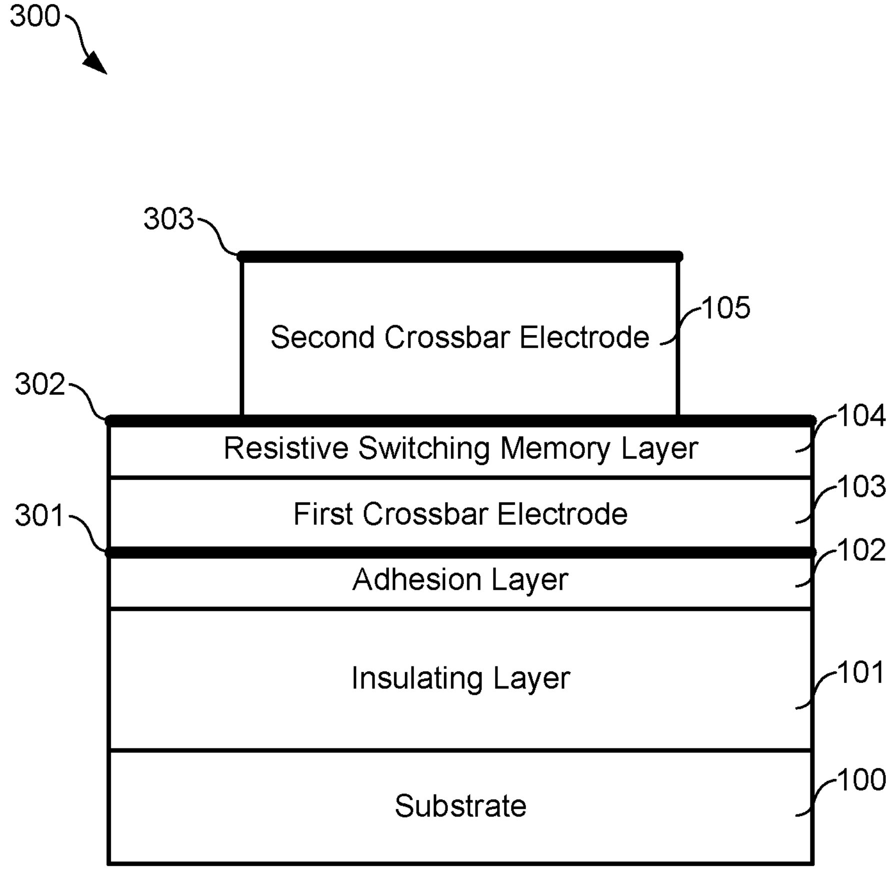
FIG. 6 illustrates a cross section of an example ReRAM memory cell with other thermally conducting layers according to various embodiments described herein.

In other embodiments, FIG. 6 illustrates a cross section of an example ReRAM memory cell 300 with other thermally conducting layers according to various embodiments described herein. The ReRAM memory cell 300 is illustrated as a representative example in FIG. 6. The shapes and relative sizes of the layers of the memory cell 300 are not necessarily drawn to scale in FIG. 6. Example dimensions of the memory cell 300 are described in further detail below, but the dimensions of the layers are not specifically limited. The layers shown in FIG. 6 are also not exhaustive, and any device(s) incorporating the memory cell 300 can include other layers and other elements not separately illustrated. Additionally, the memory cell 300 can be formed as part of a larger integrated circuit device in combination with other devices and circuit elements.

As shown in FIG. 6, the ReRAM memory cell 300 includes a substrate 100, an insulating layer 101, an adhesion layer 102, a first crossbar electrode 103, a metal oxide resistive layer 104, and a second crossbar electrode 105. The substrate 100, the layers 101, 102, and 104, and the electrodes 103 and 105 are similar to those shown in FIG. 2 for the memory cell 40.

As compared to the memory cell 40, the memory cell 300 also includes the thermally conductive layers 301, 302, and 303. As shown in FIG. 6, the thermally conductive layer 301 is formed between the adhesion layer 102 and the first crossbar electrode layer 103. The thermally conductive layer 302 is formed between the resistive layer 104 and the second crossbar electrode layer 105. The thermally conductive layer 303 is formed on the second crossbar electrode 105. In some cases, the memory cell 300 can omit one or more of the thermally conductive layers 301, 302, and 303. In another example, a thermally conductive layer similar to the layers 301, 302, and 303 can be positioned between the first crossbar electrode 103 and the resistive layer 104.

In one example, one or more of the thermally conductive layers 301, 302, and 303 can be embodied as layers of graphene. Graphene has a thermal conductivity as high as 3000-5000 W/(mK) and can be relied upon to transfer heat very quickly. In another example, one or more of the thermally conductive layers 301, 302, and 303 can be embodied as layers of boron nitride, which also has very high conductivity. The addition of the thermally conductive layers 301, 302, and 303 can also significantly reduce degradation in an array including the memory cell 300 shown in FIG. 6, as compared to the memory cell 40 shown in FIG. 2.

Thermally conductive layers 301, 302, and 303 of graphene can be formed in any suitable way using any suitable process steps, such as by mechanical exfoliation, solution processable graphene oxide (e.g., Hummers' method) followed by chemical reduction, epitaxial growth by thermal desorption, epitaxial growth by chemical vapor deposition (CVD), solvothermal synthesis, unzipping carbon nanotubes, or other methods. Thermally conductive layers 301, 302, and 303 of two-dimensional sheets of boron nitride can also be formed in any suitable way using suitable process steps, such as through atomic deposition. Graphene can also be deployed in relatively large mono-atomic sheets, in the length of a few centimeters on the side, or deposited in the form of pulver of graphene nanoplatelets. Some heat conduction layers may be common to all horizontal or vertical electrodes, provided that the electrode lines are not electrically mutually shorted, or they may be patterned along with the patterning of the electrodes.

In still other examples, a combination of the thermally conductive layers 301, 302, and 303 of graphene or boron nitride, as shown in FIG. 6, can be combined with the thermally conductive crossbar layer 201 of Cu, as shown in FIG. 5, to increase the extent and speed at which heat can be dissipated in a ReRAM memory array. In this case, the thermally conductive layer 301 can be positioned either between the crossbar electrode 103 and the thermally conductive crossbar layer 201, or below the thermally conductive crossbar layer 201.

The features, structures, or characteristics described above may be combined in one or more embodiments in any suitable manner, and the features discussed in the various embodiments are interchangeable, if possible. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms of orientation, such as "above," "below," "upper," "lower," "under," and "over," may be used to describe the structural orientation of certain elements, the terms are used for convenience only, for example, as a direction in examples shown in the drawings. It should be understood that if the device is turned upside down, the "upper" component will become a "lower" component.

As used herein, terms such as "a," "an," "the," and "said" are used to indicate the presence of one or more elements and components. The terms "comprise," "comprising," "include," "including," "have," "having," "contain," "containing," and their variants are open ended and can include additional elements, components, etc., in addition to the listed elements, components, etc. unless otherwise specified. The terms "first," "second," etc. are used only as labels, rather than a limitation for a number of the objects.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A semiconductor memory device, comprising:

a substrate;

an insulating layer formed over the substrate;

a thermally conductive horizontal crossbar layer of copper formed at a first thickness over the insulating layer for thermal dissipation of heat horizontally away from a memory cell during set and reset operations of the memory cell;

a horizontal crossbar electrode of platinum formed on the thermally conductive horizontal crossbar layer at a second thickness less than the first thickness;

a resistive switching memory layer for the memory cell formed over the horizontal crossbar electrode of platinum, the resistive switching memory layer comprising tantalum oxide;

a vertical crossbar electrode formed at a third thickness over the resistive switching memory layer; and a thermally conductive vertical crossbar layer of copper formed at a fourth thickness different than the third thickness over the vertical crossbar electrode for thermal dissipation of heat vertically away from the memory cell during the set and reset operations of the memory cell, wherein:

the thermally conductive vertical crossbar layer comprises copper and a graphene layer for thermal dissipation.

2. The semiconductor memory device according to claim 1, wherein:

the first thickness is between 100-350 nm and the second thickness is 50 nm; and the third thickness is 50 nm and the fourth thickness is between 100-350 nm.

3. The semiconductor memory device according to claim 1, wherein the thermally conductive vertical crossbar layer is formed on the vertical crossbar electrode.

4. The semiconductor memory device according to claim 3, wherein the vertical crossbar electrode comprises one of a silver, nickel, tantalum nitride, or tantalum layer formed at the third thickness on the resistive switching memory layer.

* * * * *